United States Patent
Shin et al.

(10) Patent No.: US 10,811,195 B2
(45) Date of Patent: Oct. 20, 2020

(54) SOLID ELECTROLYTIC CAPACITOR AND BOARD HAVING THE SAME

(71) Applicant: SAMSUNG ELECTRO-MECHANICS CO., LTD., Suwon-si, Gyeonggi-do (KR)

(72) Inventors: Hong Kyu Shin, Suwon-si (KR); Jae Bum Cho, Suwon-si (KR); Jae Hyuk Choi, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 610 days.

(21) Appl. No.: 15/016,956

(22) Filed: Feb. 5, 2016

(65) Prior Publication Data
US 2017/0040117 A1 Feb. 9, 2017

(30) Foreign Application Priority Data
Aug. 7, 2015 (KR) .................. 10-2015-0111696

(51) Int. Cl.
*H01G 9/012* (2006.01)
*H05K 1/18* (2006.01)
(Continued)

(52) U.S. Cl.
CPC ............ *H01G 9/012* (2013.01); *H01G 2/065* (2013.01); *H01G 9/10* (2013.01); *H01G 9/15* (2013.01);
(Continued)

(58) Field of Classification Search
CPC ............ H01G 2/065; H01G 9/10; H01G 9/15; H05K 1/111; H05K 1/181
See application file for complete search history.

(56) References Cited

U.S. PATENT DOCUMENTS

| | | | | |
|---|---|---|---|---|
| 5,560,761 A | * | 10/1996 | Naito | .......... C22C 1/045 |
| | | | | 204/292 |
| 6,346,127 B1 | * | 2/2002 | Kuriyama | .......... H01G 9/08 |
| | | | | 29/25.03 |

(Continued)

FOREIGN PATENT DOCUMENTS

| JP | 2009-094478 A | 4/2009 |
|---|---|---|
| JP | 2009-099913 A | 5/2009 |

(Continued)

OTHER PUBLICATIONS

Office Action issued in corresponding Korean Patent Application No. 10-2015-0111696 dated Mar. 18, 2020, with English translation.

*Primary Examiner* — Timothy J Thompson
*Assistant Examiner* — Rhadames Alonzo Miller
(74) *Attorney, Agent, or Firm* — Morgan, Lewis & Bockius LLP

(57) ABSTRACT

A solid electrolytic capacitor includes a capacitor body including a sintered body of tantalum powders; an anode wire having a first region in a width direction embedded in the capacitor body and a second region in the width direction led through one surface of the capacitor body; an encapsulant part enclosing the capacitor body and the anode wire; an anode terminal disposed on an outer surface of the encapsulant part and connected to the anode wire; a cathode terminal spaced apart from the anode terminal and disposed on the outer surface of the encapsulant part; and a cathode lead portion electrically connecting the capacitor body and the cathode terminal to each other, wherein at least one of the anode wire and the cathode lead portion is provided in plural.

9 Claims, 7 Drawing Sheets

(51) Int. Cl.
*H05K 1/11* (2006.01)
*H01G 9/15* (2006.01)
*H01G 9/10* (2006.01)
*H01G 2/06* (2006.01)
*H01G 9/032* (2006.01)
*H01G 9/025* (2006.01)

(52) U.S. Cl.
CPC .............. *H05K 1/111* (2013.01); *H05K 1/181* (2013.01); *H01G 9/025* (2013.01); *H01G 9/032* (2013.01)

(56) References Cited

U.S. PATENT DOCUMENTS

| | | | |
|---|---|---|---|
| 7,385,804 B2 | 6/2008 | Kuriyama | |
| 2006/0109609 A1* | 5/2006 | Kobayashi | H01G 2/065 361/523 |
| 2006/0285276 A1* | 12/2006 | Kuriyama | H01G 9/052 361/523 |
| 2008/0186652 A1* | 8/2008 | Lee | H01G 4/012 361/306.3 |
| 2009/0015988 A1 | 1/2009 | Kuriyama | |
| 2009/0080143 A1 | 3/2009 | Kobayashi et al. | |
| 2009/0103243 A1 | 4/2009 | Mizukoshi et al. | |
| 2010/0149769 A1* | 6/2010 | Lee | H01G 2/065 361/768 |
| 2013/0050893 A1* | 2/2013 | Kim | H01G 4/228 361/306.3 |
| 2013/0050897 A1* | 2/2013 | Kim | H01G 4/12 361/321.2 |
| 2013/0058006 A1* | 3/2013 | Kim | H01G 4/12 361/321.2 |
| 2015/0036265 A1 | 2/2015 | Shin et al. | |
| 2015/0090485 A1* | 4/2015 | Lee | H01G 2/065 174/260 |
| 2015/0116910 A1 | 4/2015 | Cho et al. | |
| 2016/0012970 A1* | 1/2016 | Shin | H01G 9/008 361/540 |

FOREIGN PATENT DOCUMENTS

| | | |
|---|---|---|
| KR | 10-2006-0114380 A | 11/2006 |
| KR | 10-2015-0016699 A | 2/2015 |
| KR | 10-2015-0049920 A | 5/2015 |
| WO | WO2005/015588 A1 | 2/2005 |

\* cited by examiner

SOLID ELECTROLYTIC CAPACITOR AND BOARD HAVING THE SAME

CROSS-REFERENCE TO RELATED APPLICATION

This application claims the benefit of priority to Korean Patent Application No. 10-2015-0111696, filed on Aug. 7, 2015 with the Korean Intellectual Property Office, the entirety of which is incorporated herein by reference.

TECHNICAL FIELD

The present disclosure relates a solid electrolytic capacitor and a board having the same.

BACKGROUND

Tantalum (Ta) is a widely-used metal in industries such as the aerospace industry and the defense industry. Tantalum is also used in the electric, electronic, mechanical engineering, and chemical industries because of its excellent mechanical and physical properties, such as a high melting point, excellent ductility, and corrosion resistant properties.

Tantalum may form a stable anodized coating, and it has been widely used as a material for an anode of a miniaturized capacitor.

A tantalum capacitor has a structure in which a gap generated when a tantalum powder is sintered and coagulated is utilized. Tantalum oxide ($Ta_2O_5$) may be formed on a surface of tantalum as an electrode metal through an anodizing method. The formed tantalum oxide may be used as a dielectric material, on which a manganese oxide ($MnO_2$) layer may be formed as an electrolyte-encapsulant part.

SUMMARY

An aspect of the present disclosure provides a solid electrolytic capacitor having low equivalent series inductance (ESL), and a board having the same.

According to an aspect of the present disclosure, a solid electrolytic capacitor includes: a capacitor body, an anode wire partially embedded in the capacitor body, an encapsulant part enclosing the capacitor body and the anode wire, a terminal electrode disposed on an outer surface of the encapsulant part, and a cathode lead portion electrically connecting the capacitor body and the terminal electrode to each other, wherein the number of at least one of the anode wire and the cathode lead portion is plural, and thus equivalent series inductance (ESL) may be reduced.

According to another aspect of the present disclosure, a board having a solid electrolytic capacitor includes: a printed circuit board having electrode pads disposed thereon, the solid electrolytic capacitor described above installed on the printed circuit board, and solders connecting the electrode pads and the solid electrolytic capacitor to each other.

BRIEF DESCRIPTION OF THE DRAWINGS

The above and other aspects, features, and other advantages of the present disclosure will be more clearly understood from the following detailed description taken in conjunction with the accompanying drawings, in which.

DETAILED DESCRIPTION

Figure 1:
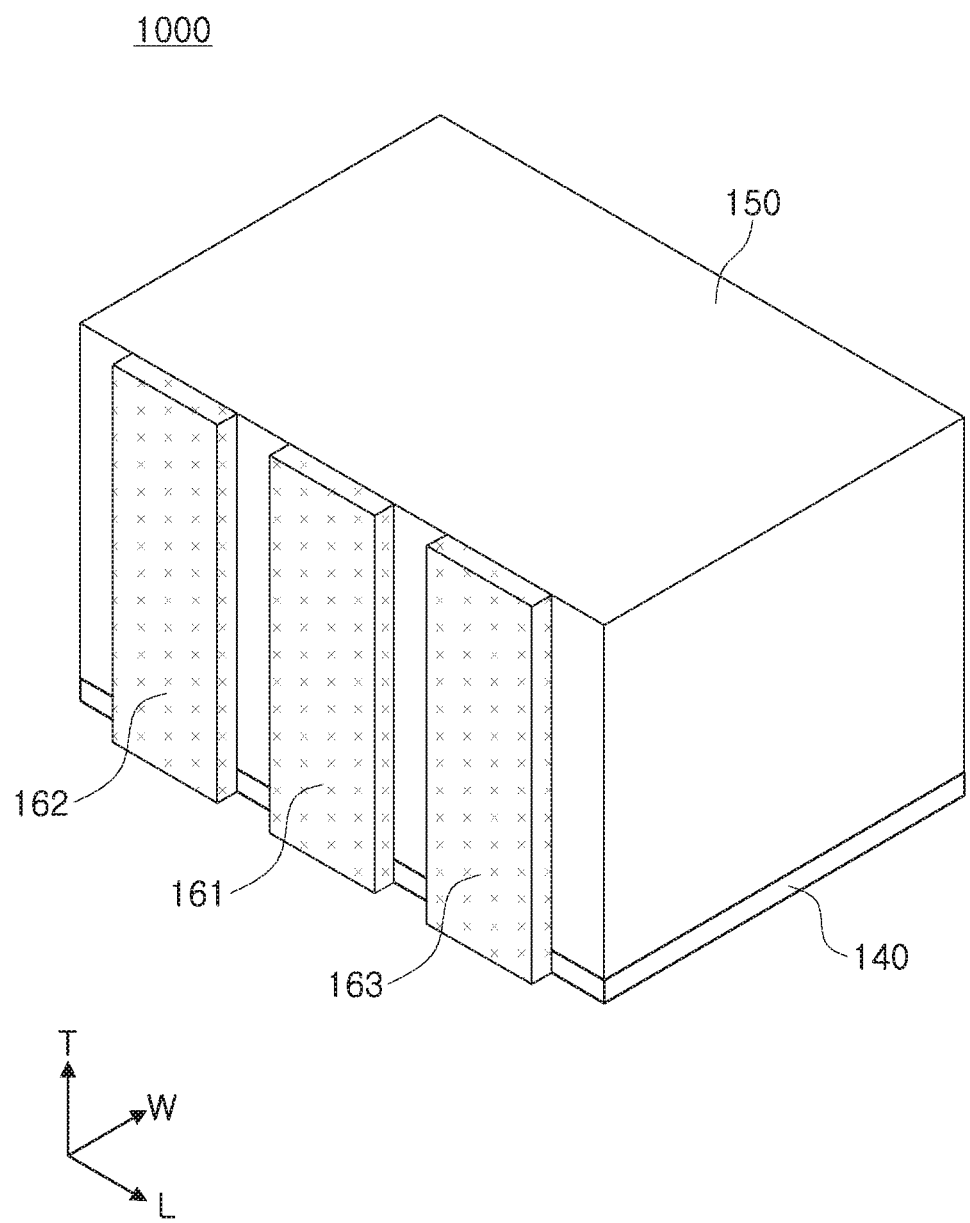
FIG. 1 is a perspective view of a solid electrolytic capacitor according to an exemplary embodiment in the present disclosure.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "upper," or "above" other elements would then be oriented "lower," or "below" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

Solid Electrolytic Capacitor

Figure 2:
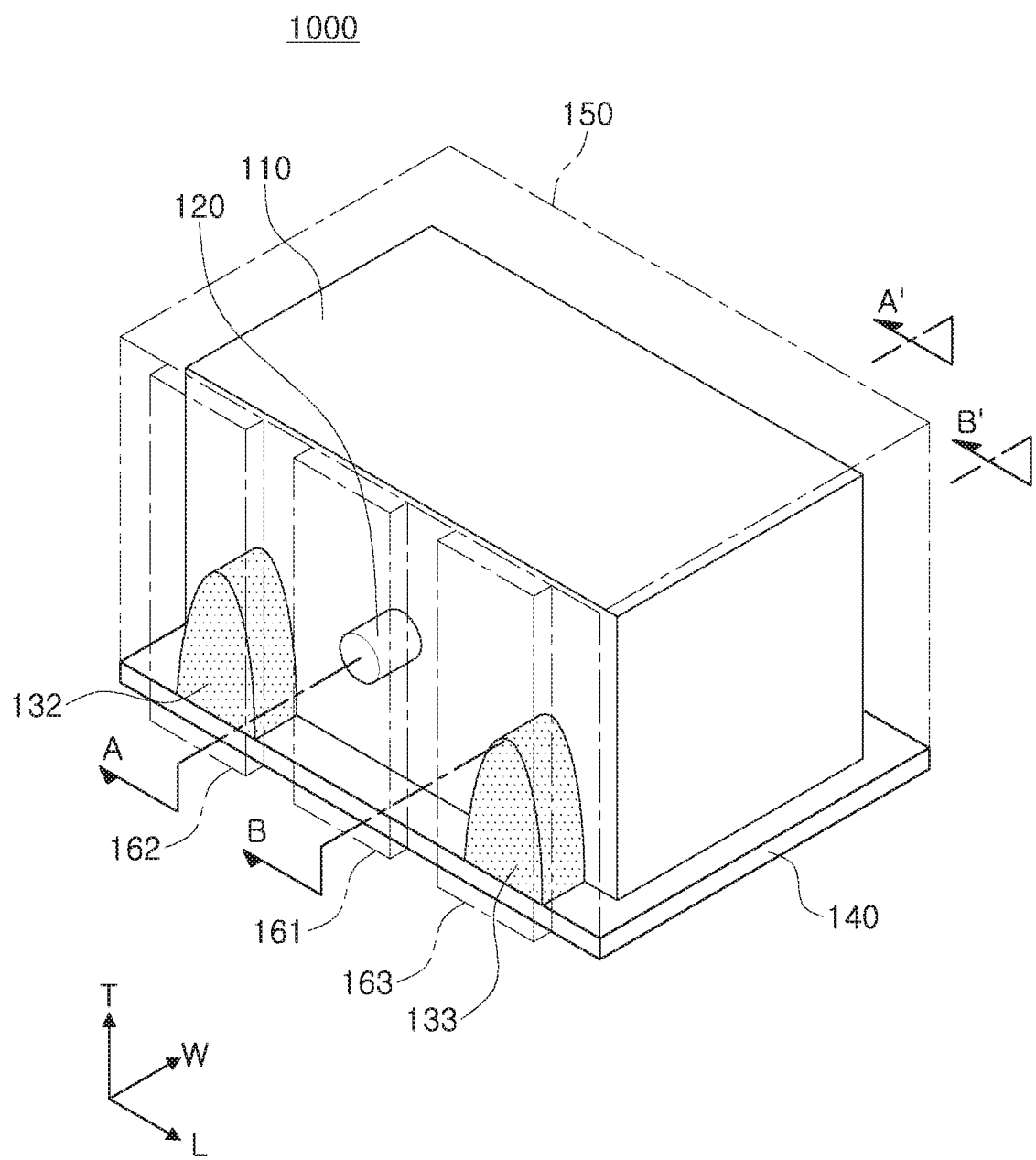
FIG. 2 is a perspective view illustrating an encapsulant part and external electrodes in the solid electrolytic capacitor according to an exemplary embodiment in the present disclosure.

FIG. 1 is a perspective view schematically illustrating a solid electrolytic capacitor according to an exemplary embodiment; and FIG. 2 is a perspective view illustrating an encapsulant part and external electrodes in the solid electrolytic capacitor according to an exemplary embodiment.

Referring to FIGS. 1 and 2, a solid electrolytic capacitor 1000 according to the present exemplary embodiment may include a capacitor body 110, an anode wire 120, an encapsulant part 150, cathode lead portions 132 and 133, and terminal electrodes 161, 162 and 163.

The capacitor body 110 may include a sintered body of tantalum powders. A partial region 121 of the anode wire 120 in a width direction may be embedded in the capacitor body, and the other region 122 of the anode wire 120 in the width direction may be led through one surface of the capacitor body 110.

The solid electrolytic capacitor according to an exemplary embodiment may further include an insulating sheet 140, and the capacitor body 110 may be disposed on the insulating sheet 140.

The capacitor body 110 may be disposed in the encapsulant part 150, and the terminal electrodes 161, 162 and 163 may be disposed on an outer surface of the encapsulant part.

The anode wire 120 and the cathode lead portions 132 and 133 may be disposed within the encapsulant part 150, and may respectively have ends led to one surface of the encapsulant part 150 to thereby be connected to the terminal electrodes 161, 162 and 163, respectively.

The terminal electrodes may include an anode terminal 161 and cathode terminals 162 and 163.

The anode wire 120 may be formed of tantalum, and a cross section of the anode wire 120 may have a cylindrical shape or a polyprismatic shape. For example, a cross section of the anode wire may have a circular shape, as illustrated in FIG. 2, or may have a square shape or a rectangular shape, although not illustrated.

In an exemplary embodiment, for convenience of explanation, a forward direction of the capacitor body 110 refers to a direction in which the anode wire 120 is exposed, a rearward direction of the capacitor body 110 refers to a direction opposing the forward direction, a width direction W of the capacitor body 110 refers to a direction that is in parallel with the forward direction and the rearward direction, a thickness direction T of the capacitor body 110 refers to one direction perpendicular to the width direction, a length direction L of the capacitor body 110 refers to one direction perpendicular to the width direction and the thickness direction, upper and lower surfaces of the capacitor body 110 refer to both surfaces of the capacitor body 110 corresponding to the thickness direction, and both side surfaces of the capacitor body 110 refer to both surfaces of the capacitor body 110 corresponding to the width direction.

The encapsulant part 150 may enclose the capacitor body 110 and the anode wire 120, and the terminal electrodes 161, 162 and 163 may be disposed on the outer surface of the encapsulant part. The encapsulant part 150 may be formed by transfer-molding a resin such as an epoxy molding compound (EMC), or the like. The encapsulant part 150 may serve to protect the solid electrolytic capacitor from external factors.

Shapes of the cathode lead portions 132 and 133 are not particularly limited, and the cathode lead portions 132 and 133 may contain a conductive material to electrically connect the cathode terminals 162 and 163 disposed on the outer surface of the encapsulant part and the capacitor body 110 disposed in the encapsulant part to each other.

For example, as illustrated in FIG. 2, the cathode lead portions 132 and 133 may be conductive resin portions formed by hardening conductive resin pastes. The conductive resin portions may contain conductive particles and a base resin.

The conductive particle may be a silver (Ag) particle, but is not limited thereto, and the base resin may be a thermosetting resin, such as an epoxy resin. In addition, the conductive resin portion may contain copper (Cu) as a conductive metal, but is not limited thereto.

The anode terminal 161 among the terminal electrodes may be connected to the anode wire 120, and the cathode lead portions 132 and 133 may be disposed to electrically connect the capacitor body 110 and the cathode terminals 162 and 163 to each other, respectively.

The anode terminal and the cathode terminal may be formed using conductive pastes formed of a conductive material such as silver (Ag), nickel (Ni), or copper (Cu), but are not limited thereto.

According to an exemplary embodiment, the number of at least one of the anode wire 120 and the cathode lead portions 132 and 133 may be plural.

As described above, when the number of at least one of the anode wire 120 and the cathode lead portions 132 and 133 is plural, a size of a current loop in the solid electrolytic capacitor may be decreased, and thus equivalent series inductance (ESL) of the solid electrolytic capacitor may be reduced.

According to an exemplary embodiment as illustrated in FIG. 2, there may be one anode wire 120, and the cathode lead portions may include a first cathode lead portion 132 and a second cathode lead portion 133. In this case, the number of the anode terminals 161 connected to the anode wire 120 is one, and the cathode terminals may include a first cathode terminal 162 connected to the first cathode lead portion 132 and a second cathode terminal 163 connected to the second cathode lead portion 133.

The anode wire 120 may be disposed between the first cathode lead portion 132 and the second cathode lead portion 133.

When the anode wire 120 is disposed between the cathode lead portions 132 and 133 as in an exemplary embodiment, mutual inductance depending on a direction of a flow of a current may be generated due to a structure in which an anode is disposed between cathodes. In this case, equivalent series inductance may be further reduced due to the generation of the mutual inductance.

According to an exemplary embodiment, the cathode lead portions 132 and 133 may be disposed on a surface of the capacitor body 110 to which the anode wire 120 is led. For example, a surface of the capacitor body 110 to which the anode wire 120 is led and a surface of the capacitor body 110 on which the cathode lead portions 132 and 133 are disposed may be the same surface. A current loop may be shorter in a case in which the anode wire and the cathode lead portions are led to and are disposed on the same surface of the capacitor body than in a case in which the anode wire and the cathode lead portions are led to and are disposed on different surfaces of the capacitor body, and thus ESL may be further reduced.

As described above, when the anode wire 120 and the cathode lead portions 132 and 133 are led to and are disposed on the same surface of the capacitor body 110, the anode terminal 161 and the cathode terminals 162 and 163 may be connected to the anode wire and the cathode lead portions, respectively, on the same surface of the encapsulant part 150.

When the anode terminal 161 and the cathode terminals 162 and 163 are disposed on the same surface of the encapsulant part 150, space efficiency may be improved when the solid electrolytic capacitor is mounted on a board.

Figure 3:
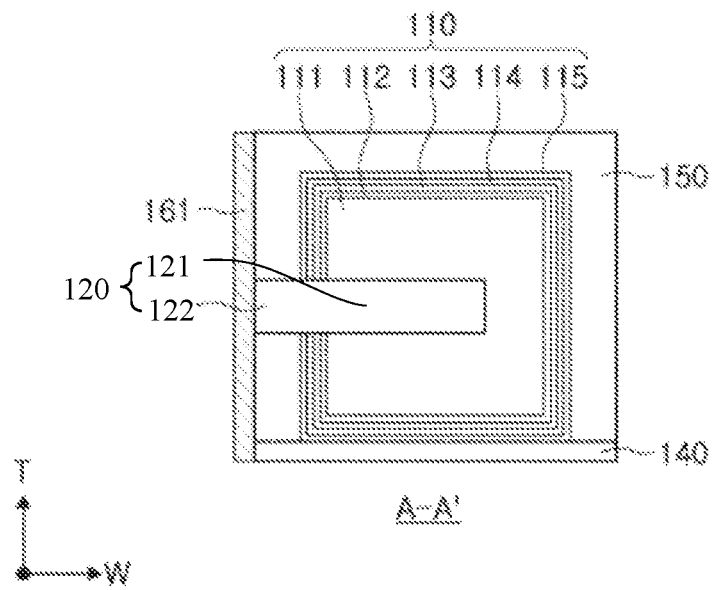
FIG. 3 is a cross-sectional view taken along line A-A' of FIG. 2.
Figure 4:
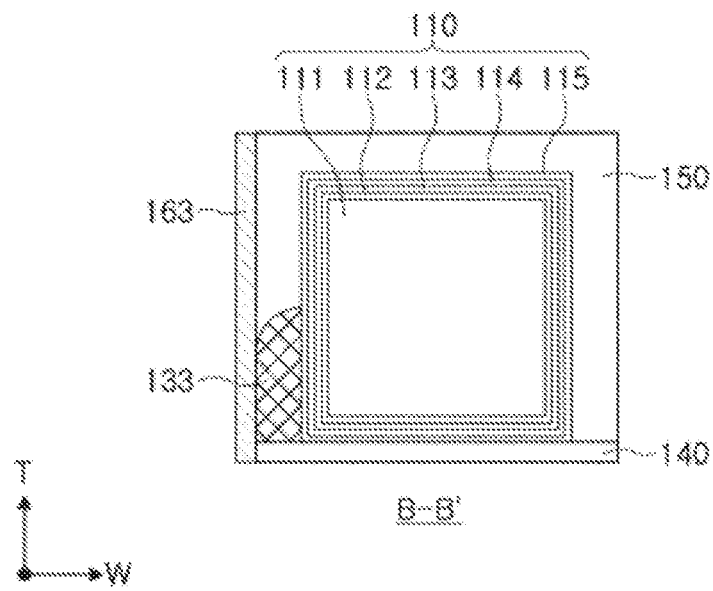
FIG. 4 is a cross-sectional view taken along line B-B' of FIG. 2.

FIG. 3 is a cross-sectional view taken along line A-A' of FIG. 2; and FIG. 4 is a cross-sectional view taken along line B-B' of FIG. 2.

The capacitor body 110 may include an anode body 111, a dielectric layer 112, a solid electrolytic layer 113, a carbon layer 114, and a cathode layer 115, as illustrated in FIGS. 3 and 4, but is not limited thereto.

The anode body 111 may embed a portion of the anode wire in the width direction therein so that a portion of the anode wire 120 is led in the forward direction.

For example, before a mixture of tantalum powders and a binder is compressed in order to form the anode body 111, the anode wire 120 may be inserted into and mounted in the mixture of the tantalum powders and the binder so that a portion of the anode wire 120 may be embedded in the center of the anode body 111.

The anode body 111 may be formed of a porous sintered material of the tantalum powders. As an example, the anode body 111 may be manufactured by mixing the tantalum powders and the binder with each other at a predetermined ratio, agitating the mixed powders, compressing the mixed powders to form the compressed powders into a rectangular parallelepiped shape, and then sintering the powders formed in the rectangular parallelepiped shape.

The dielectric layer 112 may be formed on a surface of the anode body 111. The dielectric layer may be formed by oxidizing the surface of the anode body. For example, the dielectric layer may be formed of a dielectric material formed of a tantalum oxide ($Ta_2O_5$), which is an oxide of tantalum forming the anode body, and may be formed at a predetermined thickness on the surface of the anode body.

The solid electrolytic layer 113 may be formed on a surface of the dielectric layer 112. The solid electrolytic layer may contain one or more of a conductive polymer and a manganese dioxide ($MnO_2$).

In a case in which the solid electrolytic layer 113 is formed of the conductive polymer, the solid electrolytic layer may be formed on the surface of the dielectric layer by a chemical polymerization method or an electrolytic polymerization method. A material of the conductive polymer is not particularly limited as long as it is a polymer having conductivity, but may include, for example, polypyrrole, polythiophene, polyaniline, or the like.

In a case in which the solid electrolytic layer 113 is formed of manganese dioxide ($MnO_2$), a conductive manganese dioxide may be formed on the surface of the dielectric layer by immersing the anode body having the dielectric layer formed on the surface thereof in a manganese aqueous solution such as manganese nitrate and then decomposing the manganese aqueous solution through heating.

The carbon layer 114 containing carbon may be disposed on the solid electrolytic layer 113.

The carbon layer 114 may be formed of carbon pastes, and may be formed by applying the carbon pastes in which conductive carbon material powders such as natural graphite, carbon black, or the like, are dispersed in water or an organic solvent in a state in which they are mixed with a binder, a dispersing agent, or the like onto the solid electrolytic layer.

The cathode layer 115 containing a conductive metal may be disposed on the carbon layer 114 in order to improve electrical connectivity with the cathode terminal, wherein the conductive metal contained in the cathode layer 115 may be silver (Ag).

Figure 5:
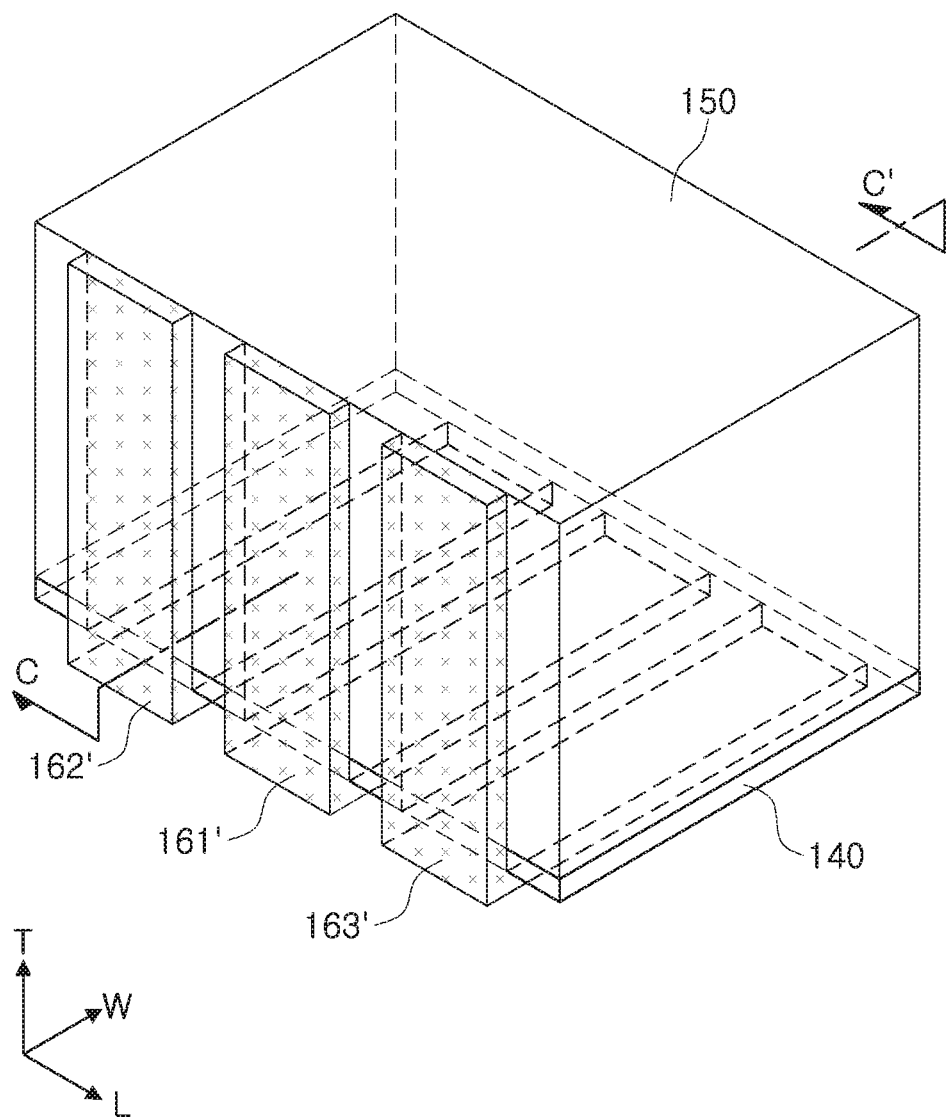
FIG. 5 is a schematic perspective view illustrating a modified example of a shape of a terminal electrode in the solid electrolytic capacitor according to an exemplary embodiment in the present disclosure.
Figure 6:
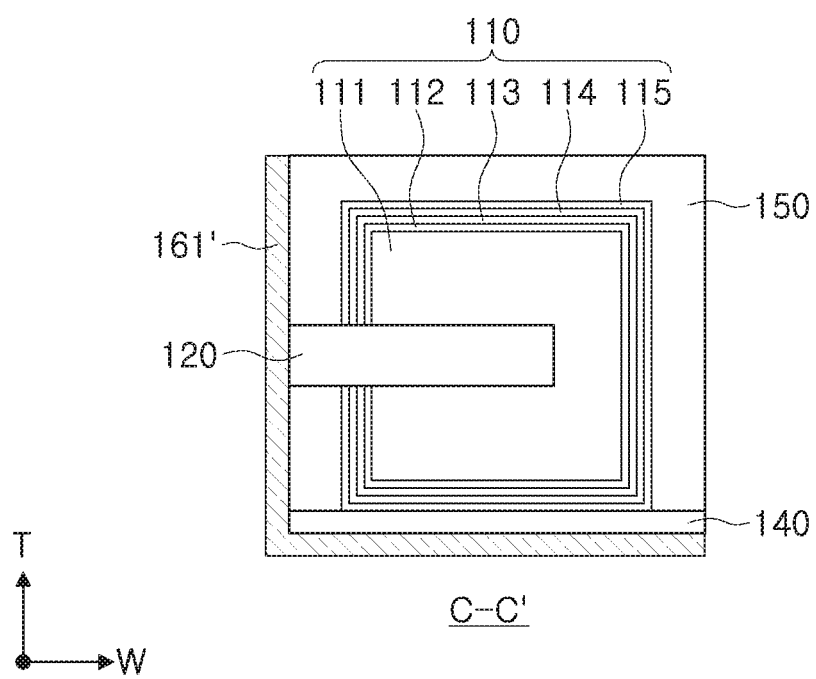
FIG. 6 is a cross-sectional view taken along line C-C' of FIG. 5.

FIG. 5 is a schematic perspective view illustrating a modified example of a shape of a terminal electrode in the solid electrolytic capacitor according to an exemplary embodiment; and FIG. 6 is a cross-sectional view taken along line C-C' of FIG. 5.

Referring to FIGS. 5 and 6, the terminal electrodes 161, 162 and 163 may be extended from one surface of the encapsulant part 150 to a lower surface of the insulating sheet 140. As described above, in a case in which the terminal electrodes are extended from one surface of the encapsulant part to the lower surface of the insulating sheet, connectivity between the terminal electrodes and circuit patterns of a board may be improved when the solid electrolytic capacitor is mounted on a board using a surface on which the insulating sheet is disposed as a mounting surface of the solid electrolytic capacitor.

Shapes of the terminal electrodes are not limited thereto, and may be variously modified, if necessary.

Figure 7:
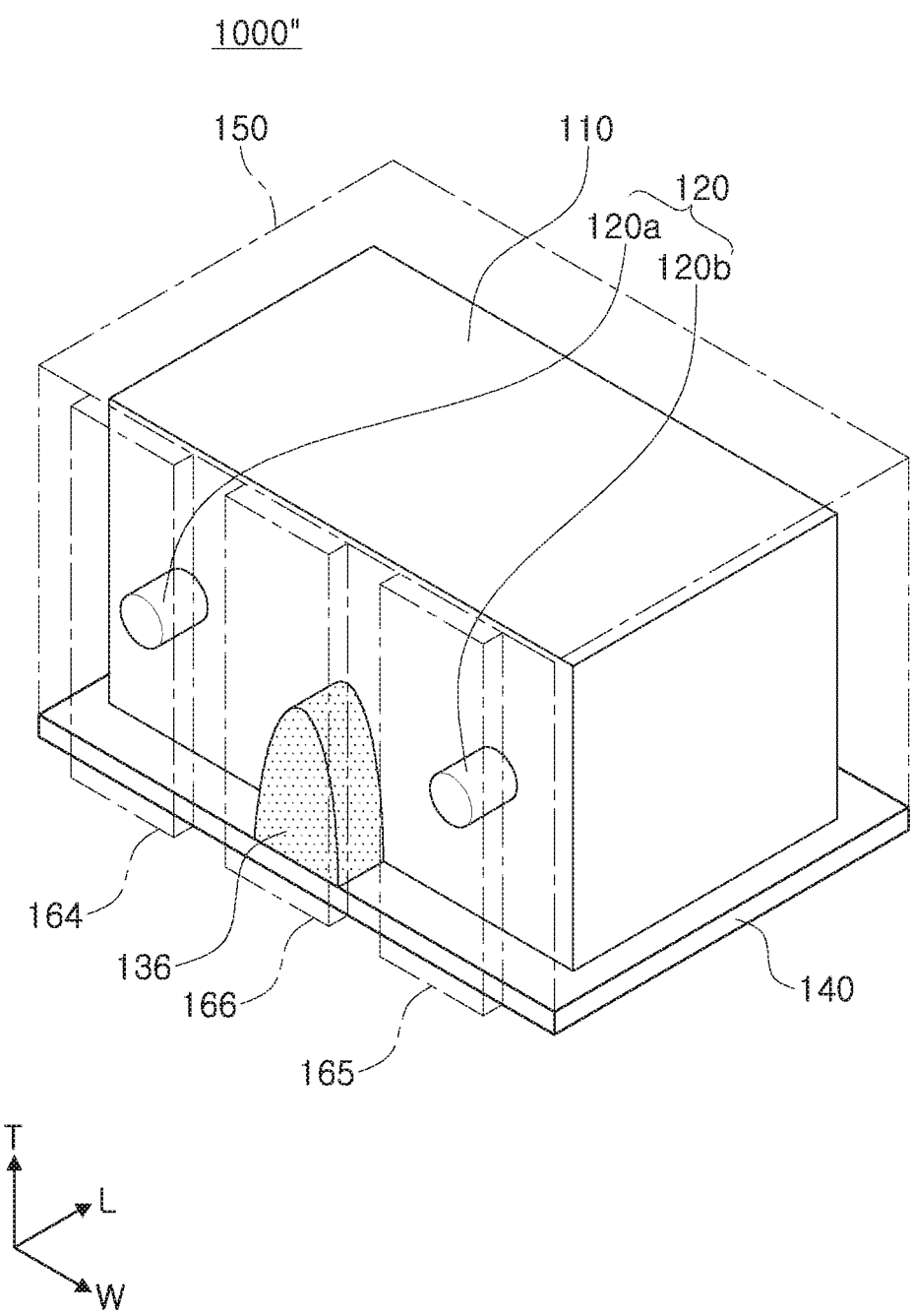
FIG. 7 is a perspective view illustrating an encapsulant part and external electrodes in another modified example of the solid electrolytic capacitor according to an exemplary embodiment in the present disclosure.

FIG. 7 is a perspective view illustrating an encapsulant part and external electrodes in another modified example of the solid electrolytic capacitor according to an exemplary embodiment.

In a solid electrolytic capacitor 1000″ according to the present modified example, the number of cathode lead portion 136 may be one, and an anode wire 120 may include a first anode wire 120a and a second anode wire 120b. An anode terminal may include a first anode terminal 164 connected to the first anode wire 120a and a second anode terminal 165 connected to the second anode wire 120b.

When the number of anode wires is plural as in the present modified example, a size of a current loop in the solid electrolytic capacitor may be reduced, and thus equivalent series inductance (ESL) of the solid electrolytic capacitor may be reduced.

The cathode lead portion 136 may be disposed between the first anode wire 120a and the second anode wire 120b.

When the cathode lead portion is disposed between the anode wires as in an exemplary embodiment, mutual inductance may be generated by flows of currents in opposite directions. In this case, ESL may be further reduced due to the generation of mutual inductance.

A description for components overlapping those of the solid electrolytic capacitor according to the exemplary embodiment described above will be omitted in order to avoid a redundant description.

Board Having Solid Electrolytic Capacitor

Figure 8:
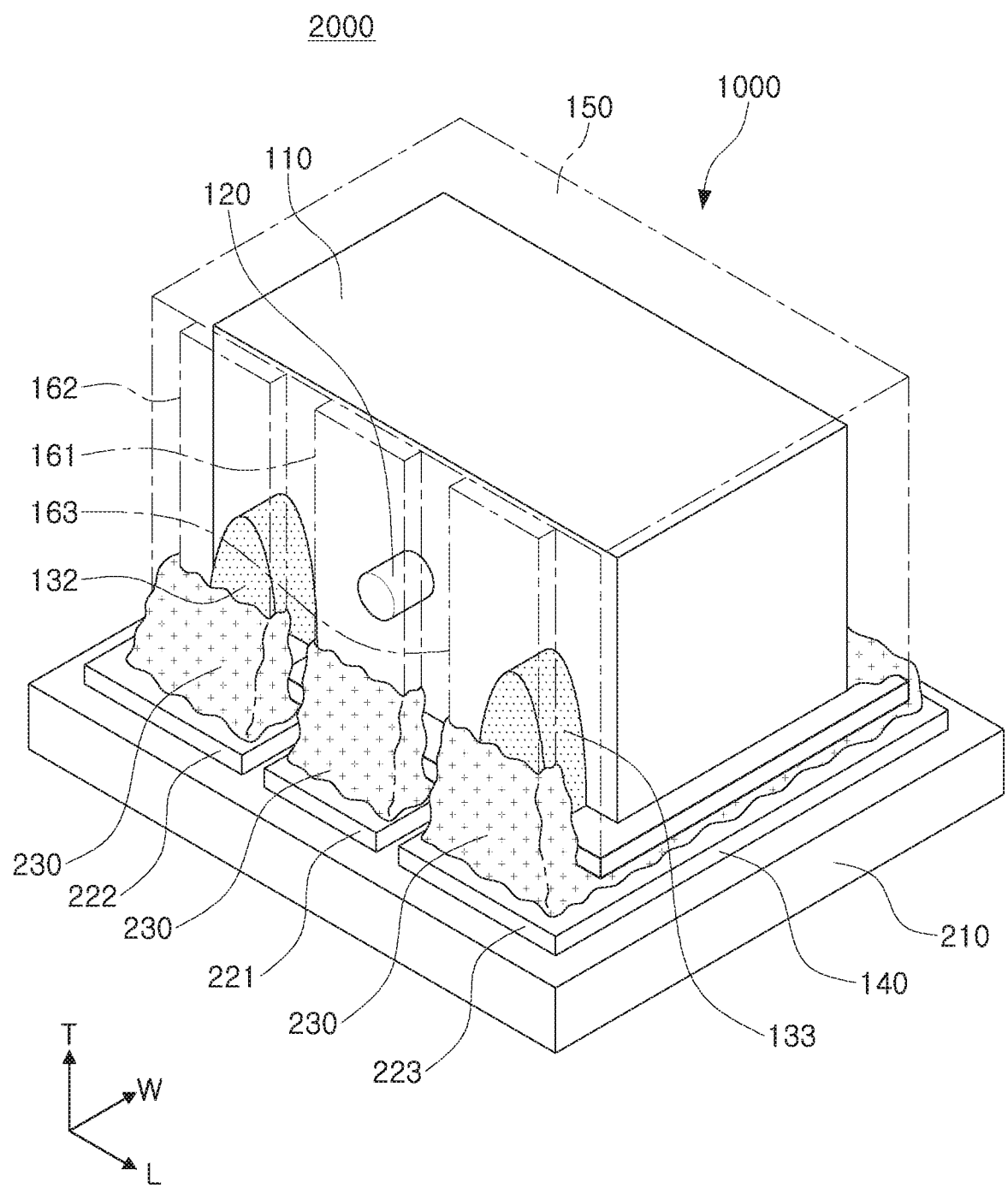
FIG. 8 is a perspective view illustrating a board in which the solid electrolytic capacitor according to an exemplary embodiment in the present disclosure is mounted on a printed circuit board.

FIG. 8 is a perspective view illustrating a board in which the solid electrolytic capacitor according to an exemplary embodiment is mounted on a printed circuit board.

Referring to FIG. 8, a board 2000 having a solid electrolytic capacitor according to an exemplary embodiment may include a printed circuit board 210 having electrode pads 221, 222 and 223 disposed thereon, the solid electrolytic capacitor 1000 installed on the printed circuit board 210, and solders 230 connecting the electrode pads 221, 222 and 223 and the solid electrolytic capacitor 1000 to each other.

The board 200 having a solid electrolytic capacitor according to the present exemplary embodiment may include the printed circuit board 210 on which the solid electrolytic capacitor 1000 is mounted and three or more electrode pads 221, 222 and 223 formed on an upper surface of the printed circuit board 210.

The electrode pads 221, 222 and 223 may be connected to the terminal electrodes 161, 162 and 163 of the solid electrolytic capacitor, respectively.

Here, the terminal electrodes 161, 162 and 163 of the solid electrolytic capacitor may be electrically connected to the printed circuit board 210 by the solders 230 in a state in which they are positioned on the electrode pads 221, 222 and 223, respectively, to contact the electrode pads 221, 222 and 223, respectively.

As set forth above, according to an exemplary embodiment, a solid electrolytic capacitor having low ESL, and a board having the same, may be provided.

In addition, according to an exemplary embodiment, a solid electrolytic capacitor having high space efficiency when mounted on a board, and a board having the same, may be provided.

While exemplary embodiments have been shown and described above, it will be apparent to those skilled in the art that modifications and variations could be made without departing from the scope of the present invention as defined by the appended claims.

What is claimed is:

1. A solid electrolytic capacitor comprising:
a capacitor body including a sintered body of tantalum powder;
an anode wire having a first region extending in a width direction of the capacitor body and embedded in the capacitor body such that the first region is surrounded by the tantalum powder, and a second region extending from the first region in the width direction through a first surface of the capacitor body;
an encapsulant part enclosing the capacitor body and the anode wire;
two cathode terminals spaced apart and disposed on an outer surface of the encapsulant part, the anode wire being exposed from the outer surface;
an anode terminal disposed between the two cathode terminals on the outer surface of the encapsulant part and connected to the anode wire; and
two cathode lead portions embedded in the encapsulant part, disposed on the first surface of the capacitor body, and electrically connecting the capacitor body and the two cathode terminals to each other, respectively,
wherein the anode terminal and the two cathode terminals are disposed on the same outer surface of the encapsulant part, from which the anode wire is exposed,
the same outer surface of the encapsulant part is intersected by the width direction, and
in the width direction, the anode terminal completely covers a surface of the anode wire exposed from the outer surface.

2. The solid electrolytic capacitor of claim 1, wherein the anode terminal is connected to the anode wire, and the two cathode terminals are connected to the two cathode lead portions, respectively, on the same outer surface of the encapsulant part.

3. The solid electrolytic capacitor of claim 1, wherein a number of anode wires is one.

4. The solid electrolytic capacitor of claim 1, wherein the anode wire is disposed between the two cathode lead portions.

5. The solid electrolytic capacitor of claim 1, further comprising an insulating sheet disposed beneath the capacitor body,
wherein the capacitor body is disposed on the insulating sheet.

6. The solid electrolytic capacitor of claim 5, wherein each of the anode terminal and the two cathode terminals extends from the outer surface of the encapsulant part to a lower surface of the insulating sheet.

7. The solid electrolytic capacitor of claim 1, wherein the capacitor body includes a solid electrolytic layer.

8. The solid electrolytic capacitor of claim 7, wherein the solid electrolytic layer contains one or more selected from the group consisting of a conductive polymer and manganese dioxide ($MnO_2$).

9. The solid electrolytic capacitor of claim 8, wherein the conductive polymer includes at least one selected from the group consisting of polypyrrole, polythiophene, and polyaniline.

* * * * *